United States Patent
Jeon et al.

(10) Patent No.: US 12,444,577 B2
(45) Date of Patent: Oct. 14, 2025

(54) APPARATUS AND METHOD FOR PROCESSING SUBSTRATE

(71) Applicant: SEMES CO., LTD., Chungcheongnam-do (KR)

(72) Inventors: Young Eun Jeon, Ulsan (KR); Yun Sang Kim, Gyeonggi-do (KR); Min Sung Jeon, Gyeonggi-do (KR); Ji Heon Kim, Gyeonggi-do (KR); Youngjo Jin, Gyeonggi-do (KR); Jin Hee Hong, Gyeonggi-do (KR); Sung Min Choi, Gyeonggi-do (KR); Dong Young Jang, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 630 days.

(21) Appl. No.: 17/865,395

(22) Filed: Jul. 15, 2022

(65) Prior Publication Data
US 2023/0154730 A1    May 18, 2023

(30) Foreign Application Priority Data
Nov. 16, 2021   (KR) .......................... 10-2021-0158009

(51) Int. Cl.
*H01J 37/32* (2006.01)
*H10B 43/27* (2023.01)

(52) U.S. Cl.
CPC .... *H01J 37/3244* (2013.01); *H01J 37/32522* (2013.01); *H10B 43/27* (2023.02); *H01J 2237/022* (2013.01); *H01J 2237/334* (2013.01)

(58) Field of Classification Search
CPC ............. H01J 37/3244; H01J 37/32522; H01J 37/32449; H01J 2237/022;
(Continued)

(56) References Cited

U.S. PATENT DOCUMENTS

| | | | |
|---|---|---|---|
| 9,953,843 B2 | 4/2018 | Shen et al. |
| 10,692,724 B2 | 6/2020 | Smith et al. |

(Continued)

FOREIGN PATENT DOCUMENTS

| | | |
|---|---|---|
| JP | 2017-152689 | 8/2017 |
| KR | 10-2019-0093593 | 8/2019 |

(Continued)

OTHER PUBLICATIONS

Notice of Allowance dated Dec. 5, 2024 for Korean Patent Application No. 10-2021-0158009 and its English translation from Global Dossier.

*Primary Examiner* — Fernando L Toledo
*Assistant Examiner* — Ryan T. Fortin
(74) *Attorney, Agent, or Firm* — WOMBLE BOND DICKINSON (US) LLP

(57) ABSTRACT

A substrate processing method capable of stably performing atomic layer etching without damaging a process chamber comprises providing a substrate including a target layer in a chamber, forming a first plasma in the chamber by using a first gas containing chlorine to first reform the target layer, forming a second plasma in the chamber by using a second gas containing oxygen to second reform the first reformed target layer, providing a precursor into the chamber to react the second reformed target layer with the precursor, and removing at least a portion of the target layer by repeating forming the first plasma, forming the second plasma, and providing the precursor.

17 Claims, 8 Drawing Sheets

(58) Field of Classification Search
CPC .......... H01J 2237/334; H01L 21/31122; H01L 21/67069; H01L 21/02175; H01L 21/31116; H10B 43/27; H10B 43/35
See application file for complete search history.

(56) References Cited

U.S. PATENT DOCUMENTS

| | | |
|---|---|---|
| 10,787,744 B2 | 9/2020 | George et al. |
| 2015/0145020 A1* | 5/2015 | Kim .................... H10D 30/693 438/269 |
| 2015/0270140 A1* | 9/2015 | Gupta ............... H01L 21/32136 216/67 |
| 2018/0182634 A1 | 6/2018 | Smith et al. |
| 2018/0204738 A1 | 7/2018 | Shen et al. |
| 2019/0055654 A1 | 2/2019 | George et al. |
| 2019/0385862 A1* | 12/2019 | Yang ................. H01L 21/67063 |
| 2021/0005425 A1* | 1/2021 | Yang ................. H01L 21/31116 |
| 2021/0193473 A1* | 6/2021 | Kwon .............. H01J 37/32091 |
| 2021/0293998 A1* | 9/2021 | Shklover ............ G03F 7/70958 |
| 2022/0084838 A1 | 3/2022 | Zhang et al. |

FOREIGN PATENT DOCUMENTS

| | | | |
|---|---|---|---|
| KR | 10-2020-0128185 | 11/2020 | |
| KR | 10-2021-0077789 | 6/2021 | |
| KR | 10-2021-0105439 | 8/2021 | |
| WO | WO-2020150043 A1 * | 7/2020 | ............. H01L 21/67 |
| WO | WO-2020263766 A1 * | 12/2020 | ............. H01L 21/02 |

\* cited by examiner

APPARATUS AND METHOD FOR PROCESSING SUBSTRATE

This application claims the benefit of Korean Patent Application No. 10-2021-0158009, filed on Nov. 16, 2021, in the Korean Intellectual Property Office, the disclosure of which is incorporated herein by reference in its entirety.

BACKGROUND

1. Technical Field

The present invention relates to a substrate processing apparatus and method.

2. Description of the Related Art

When manufacturing a semiconductor device, various processes such as etching, photography, ashing, ion implantation, thin film deposition, and cleaning are performed.

Here, among the etching processes, atomic layer etching (ALE) is a technology capable of controlling the etch depth of the target layer to an atomic level while minimizing electrical and physical damage. Atomic layer etching is regarded as an essential technology for making nanometer-level electronic circuits.

SUMMARY

Meanwhile, when performing atomic layer etching of aluminum oxide ($Al_2O_3$), plasma based on a fluorine-based source (e.g., $NbF_5$) has been used. However, the fluorine-based source corrodes the inner wall/part of the process chamber or is adsorbed to the inner wall/part, and thus is not easily cleaned.

An object of the present invention is to provide a substrate processing method capable of stably performing atomic layer etching without damaging a process chamber.

Another object of the present invention is to provide a substrate processing apparatus for performing the substrate processing method.

The objects of the present invention are not limited to the objects mentioned above, and other objects not mentioned will be clearly understood by those skilled in the art from the following description.

One aspect of the substrate processing method of the present invention for achieving the above object comprises providing a substrate including a target layer in a chamber, forming a first plasma in the chamber by using a first gas containing chlorine to first reform the target layer, forming a second plasma in the chamber by using a second gas containing oxygen to second reform the first reformed target layer, providing a precursor into the chamber to react the second reformed target layer with the precursor, and removing at least a portion of the target layer by repeating forming the first plasma, forming the second plasma, and providing the precursor.

Another aspect of the substrate processing method of the present invention for achieving the above object comprises introducing a substrate having a semiconductor device formed thereon into a chamber, wherein the semiconductor device includes a first interlayer insulating film, a second interlayer insulating film formed on the first interlayer insulating film, a semiconductor pattern penetrating the first interlayer insulating film and the second interlayer insulating film, a charge trap film conformally formed along an upper surface of the first interlayer insulating film, a lower surface of the second interlayer insulating film, and a sidewall of the semiconductor pattern, a blocking film conformally formed along the charge trap film, and a conductive film formed to be in contact with the blocking film, wherein a portion of the blocking film is exposed by the conductive film, forming a first plasma in the chamber by using a first gas containing chlorine, forming a second plasma in the chamber by using a second gas containing oxygen, providing a precursor into the chamber to react the precursor with the blocking film exposed by the conductive film, and removing at least a portion of the blocking film exposed by the conductive film by repeating forming the first plasma, forming the second plasma, and providing the precursor.

One aspect of the substrate processing apparatus of the present invention for achieving the above object comprises a heat source installed in a chamber and for heating a substrate, a gas supply system for supplying a first gas, a second gas and a precursor into the chamber, an electrode system for generating plasma using the first gas or the second gas supplied into the chamber, and a controller for controlling the heat source, the gas supply system and the electrode system to atomic layer etch a target layer of the substrate, wherein the atomic layer etching comprises supplying a first gas containing chlorine into the chamber and forming a first plasma based on the first gas to first reform the target layer, supplying a second gas containing oxygen into the chamber and forming a second plasma based on the second gas to second reform the first reformed target layer, providing a precursor into the chamber to react the second reformed target layer with the precursor, and removing at least a portion of the target layer by repeating forming the first plasma, forming the second plasma, and providing the precursor.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
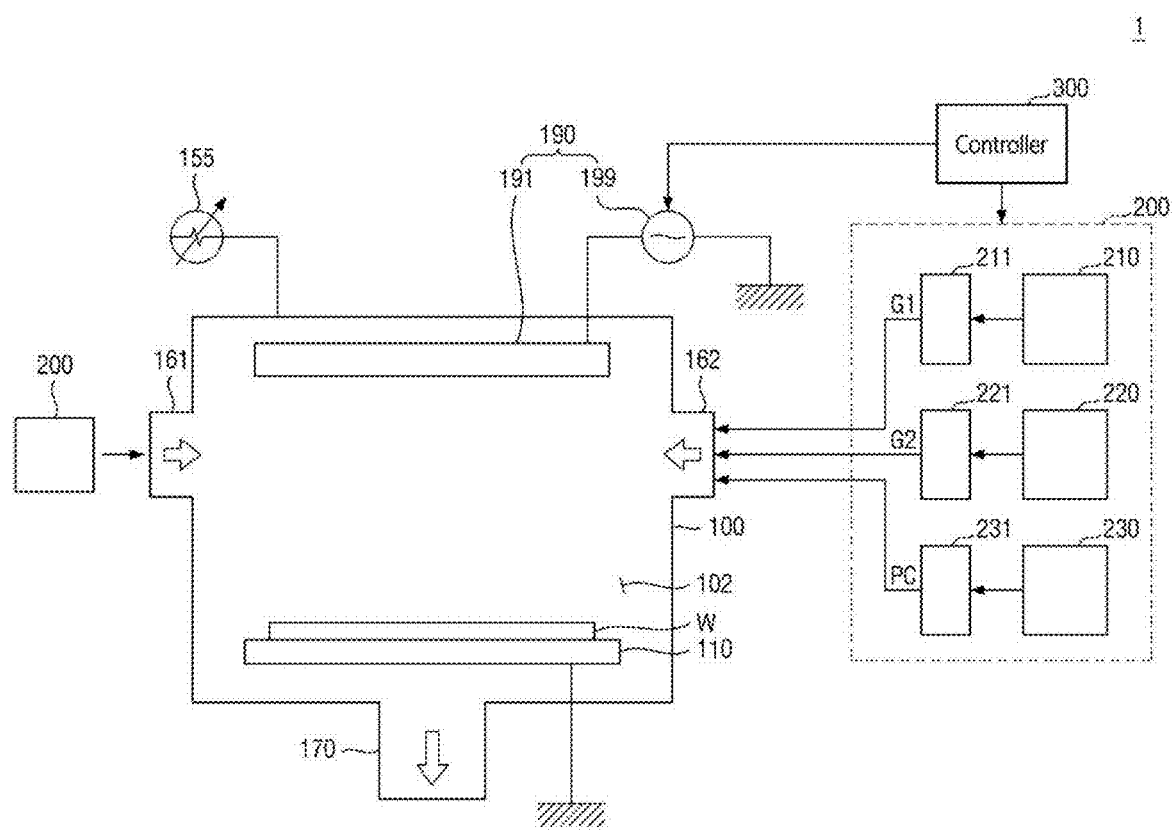
FIG. 1 is a view for describing a substrate processing apparatus according to an embodiment of the present invention.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

FIG. 1 is a view for describing a substrate processing apparatus according to an embodiment of the present invention.

Referring to FIG. 1, a substrate processing apparatus 1 according to an embodiment of the present invention is an apparatus for performing atomic layer etching. The substrate processing apparatus 1 includes a chamber 100, a heat source 155, an electrode system 190, a gas supply system 200, and a controller 300.

A target layer is formed on the substrate W, and at least a portion of the target layer may be etched by an atomic layer etching method, which will be described later. The target layer may include at least one of a metal oxide (e.g., aluminum oxide (Al2O3), hafnium oxide (HfO2), zirconium oxide (ZrO2), silicon oxide (SiO2), silicon nitride (Si3N4), or titanium nitride (TiN)).

The chamber 100 provides a processing space 102, in which the substrate W is processed. For example, the chamber 100 may have a circular cylindrical shape and may be made of a metal material. Inlets 161 and 162, through which process gases are supplied, are installed on the sidewall of the chamber 100. An outlet 170 for discharging by-products generated in the processing space 102 to the outside is installed on the bottom surface of the chamber 100.

A heat source 155 may be installed on the upper surface of the chamber 100. The heat source 155 may be a flash lamp, an IR lamp, an RTP, a laser, a heater, or the like, but is not limited thereto. The heat source 155 adjusts the temperature of the substrate W to a temperature range suitable for atomic layer etching. For example, the heat source 155 may control the temperature of the substrate W to 50° C. or more and 400° C. or less, but is not limited thereto. The substrate support 110 is installed in the processing space 102 of the chamber 100 and the substrate W is seated on the substrate support 110.

The electrode system 190 may comprise an upper electrode 191, an RF generator 199, a lower electrode (not shown), and the like. The RF generator 199 may comprise an RF source that generates an RF bias and a matching network that adjusts the impedance of the RF bias. An impedance-adjusted RF bias is provided to the upper electrode 191. The lower electrode (not shown) may be embedded in the substrate support 110 and may be grounded.

The gas supply system 200 is configured to supply process gases through the inlets 161 and 162. That is, the gas supply system 200 selectively provides the first gas G1, the second gas G2, and the precursor PC into the chamber 100. Although not shown separately, the gas supply system 200 additionally provides an inert gas (e.g., Ar) into the chamber 100.

The first gas storage unit 210 stores the first gas G1, and the first flow rate control unit 211 provides an appropriate flow rate to the chamber 100 according to the control of the controller 300. The first flow rate control unit 211 may include a valve, a mass flow controller (MFC), and the like. The first gas G1 is a chlorine-containing gas (i.e., a chlorine-based source), and may be, for example, at least one selected from the group comprising $Cl_2$, HCl, $SiCl_4$, $CCl_4$, and $BCl_3$.

The second gas storage unit 220 stores the second gas G2, and the second flow rate control unit 221 provides an appropriate flow rate to the chamber 100 according to the control of the controller 300. The second gas G2 is a gas containing oxygen (i.e., an oxygen-based source), and may be, for example, at least one selected from the group comprising $O_2$, $H_2O$, $N_2O$, and $O_3$.

The third gas storage unit 230 stores the precursor PC, and the third flow rate control unit 231 provides an appropriate flow rate to the chamber 100 according to the control of the controller 300. The precursor PC may include a diketone-based gas. The precursor (PC) may be, for example, at least one selected from the group comprising Hfac (Hexafluoroacetylacetone), Acac (Acetylacetone), and Dmac (Dimethylacetamide).

The controller 300 is configured to control the heat source 155, the gas supply system 200, the electrode system 190, and the like to atomic layer etch the target layer of the substrate W.

Figure 2:
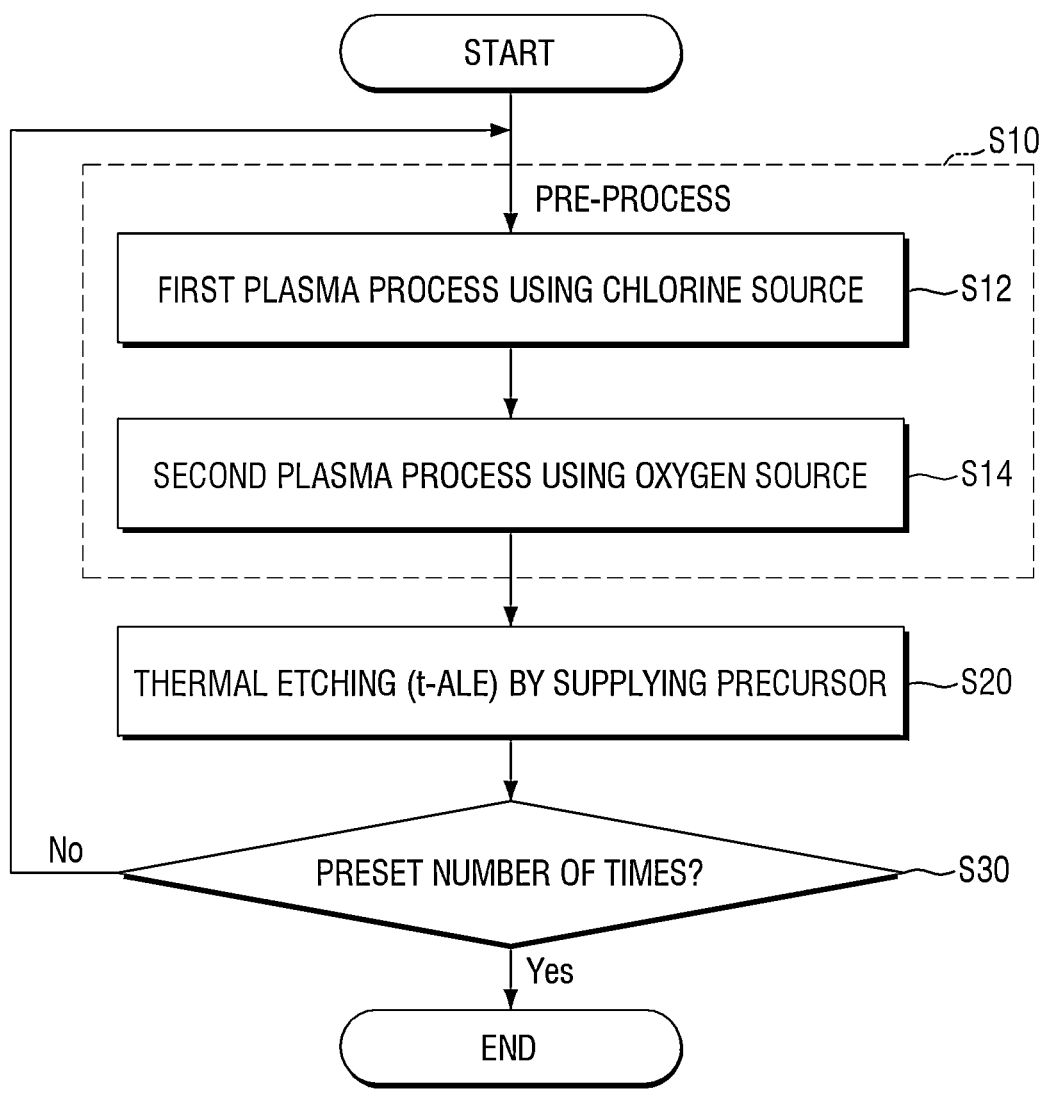
FIG. 2 is a flowchart illustrating a substrate processing method according to some embodiments of the present invention.
Figure 3:
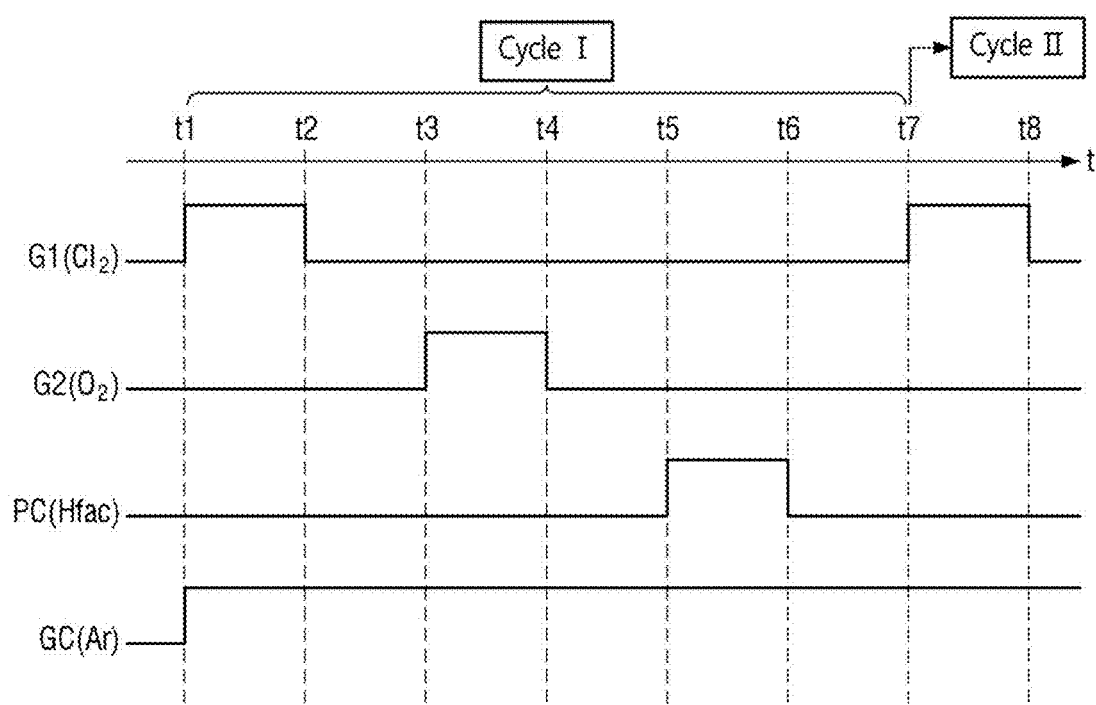
FIG. 3 is a timing diagram illustrating the substrate processing method of FIG. 2.

Hereinafter, an atomic layer etching method will be described in detail with reference to FIGS. 2 and 3. FIG. 2 is a flowchart illustrating a substrate processing method according to some embodiments of the present invention. FIG. 3 is a timing diagram illustrating the substrate processing method of FIG. 2.

Referring to FIGS. 1 and 2, hereinafter, the target layer formed on the substrate W will be described as an aluminum oxide ($Al_2O_3$).

The target layer formed on the substrate W is etched by an atomic layer etching method. Atomic layer etching proceeds by continuously repeating a cycle. One cycle may proceed within 1 second (maximum 3 seconds). One cycle may proceed from nanoseconds (ns) to milliseconds (ms). One cycle includes the following steps. One cycle includes pre-processing (S10) of the substrate W and thermal etching (i.e, t-ALE) (S20) of the pre-processed substrate W.

Specifically, the pre-processing (S10) includes two consecutive plasma processing (S12 and S14).

The substrate W is subjected to a first plasma processing using a chlorine source (S12).

Specifically, the first gas G1 (i.e., chlorine source) containing chlorine is supplied into the chamber 100. The first gas G1 may be, for example, at least one selected from the group comprising $Cl_2$, HCl, $SiCl_4$, $CCl_4$, and $BCl_3$. Hereinafter, a case, in which the first gas G1 is $Cl_2$, is exemplified.

A first plasma is formed based on the first gas G1, and the target layer (i.e., $Al_2O_3$) is first reformed by the first plasma as shown in Chemical Formula 1 below. In Chemical Formula 1 below, the subscript (s) represents a solid.

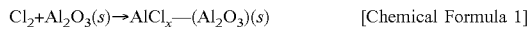
[Chemical Formula 1]

Next, the substrate W is subjected to a first plasma processing using an oxygen source (S14).

Specifically, the second gas G2 (i.e., an oxygen source) containing oxygen is supplied into the chamber 100. The second gas G2 may be, for example, at least one selected from the group comprising $O_2$, $H_2O$, $N_2O$, and $O_3$. Hereinafter, the case where the second gas G2 is $O_2$ is exemplified.

A second plasma is formed based on the second gas G2, and the first reformed target layer $AlCl_x$—$(Al_2O_3)$ is second reformed by the second plasma as shown in Chemical Formula 2 below. In Chemical Formula 2 below, the subscript (s) represents a solid.

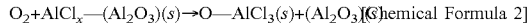
[Chemical Formula 2]

Then, a precursor is supplied and thermal etching (t-ALE) is performed (S20).

Specifically, the thermal etching (S20) includes providing the precursor PC into the chamber 100 while maintaining the substrate W at a preset temperature (i.e., a third temperature). The precursor PC may include a diketone-based gas. The precursor PC may be, for example, at least one selected from the group comprising Hfac (Hexafluoroacetylacetone), Acac (Acetylacetone), and Dmac (Dimethylacetamide). Hereinafter, a case, in which the precursor PC is Hfac, is exemplified.

The second reformed target layer (O—$AlCl_3$) and the precursor PC react, and a portion of the target layer is removed as shown in Chemical Formula 3. In Chemical Formula 3 below, the subscript (s) represents a solid, and the subscript (g) represents a gas.

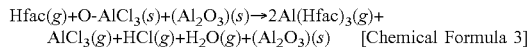
[Chemical Formula 3]

Meanwhile, during the thermal etching (S20), the substrate W may be maintained at a preset temperature, that is, 50° C. or more and 400° C. or less. Within a temperature range of 50° C. or more and 400° C. or less, if the temperature is increased, the thickness of the target layer etched in one cycle may be increased. For example, when the substrate W is maintained at 150° C., 0.01 Å to 0.05 Å may be etched in one cycle. When the substrate W is maintained at 250° C., 0.1 Å to 0.25 Å may be etched in one cycle. When the substrate W is maintained at 350° C., 0.85 Å to 2 Å may be etched in one cycle. This thickness is exemplary, and may vary depending on the type, supply amount, etc. of the first gas G1, the second gas G2, and the precursor PC.

In addition, the set temperature of the substrate W during the thermal etching (S20) may be selected differently depending on the material type of the target layer, the thickness of the target layer, the amount to be etched, the process time, and the like. That is, according to some embodiments of the present invention, the thermal etching (S20) has a wide etch window from a low temperature (e.g., 50° C.) to a high temperature (e.g., 400° C.).

Then, it is checked whether the cycle is repeated for a preset number of times (S30). If the cycle is not repeated for a preset number of times, the process returns to the pre-processing step S10. On the other hand, when the cycle is repeated for a preset number of times, the atomic layer etching is terminated.

Meanwhile, during the first plasma processing (S12), the substrate W may be controlled to the first temperature, and during the second plasma processing (S14), the substrate W may be controlled to the second temperature. In addition, during thermal etching (S20) by supplying a precursor, the substrate W may be controlled to the third temperature.

The first temperature and the second temperature may be the same as each other.

The third temperature may be controlled to be the same as the first temperature and the second temperature. That is, during the first plasma processing (S12), the second plasma processing (S14), and the thermal etching (t-ALE) (S20), the temperature of the substrate W may be controlled to be the same.

Alternatively, the first temperature and the second temperature may be controlled to be the same as each other, and the third temperature may be controlled to be higher than the first temperature and the second temperature. In order to freely control the temperature in each step (S12, S14, S20), the heat source 155 may be installed on the side wall (see FIG. 5) or the upper surface (see FIG. 1) of the chamber 100.

By using the heat source 155 using a flash lamp or the like, the temperature of the substrate W may be controlled differently for each step of the first plasma processing (S12), the second plasma processing (S14), and the thermal etching (t-ALE) (S20). For example, in the first plasma processing (S12) and the second plasma processing (S14), the temperature of the substrate W may be maintained at the same temperature, and in the thermal etching (S20), the temperature of the substrate W may be increased. Here, referring to FIG. 3, a cycle (cycle I) corresponds to times t1 to t7. The first plasma processing S12 corresponds to time t1 to t3, the second plasma processing S14 corresponds to time t3 to t5, and the thermal etching S20 corresponds to time t5 to t7.

At times t1 to t2, a first gas G1 including chlorine is provided into the chamber 100, and a first plasma is formed in the chamber 100. Along with the first gas G1, an inert gas GC (e.g., Ar) is also provided into the chamber 100. The inert gas GC serves as a carrier for transporting the first gas G1. The target layer is first reformed through the first plasma.

At time t2 to t3, the inert gas GC continues to be provided. The inert gas GC is for exhausting by-products inside the chamber 100.

At times t3 to t4, the second gas G2 including oxygen is provided into the chamber 100, and a second plasma is formed in the chamber 100. Along with the second gas G2, an inert gas GC (e.g., Ar) is also provided into the chamber 100. The inert gas GC serves as a carrier for transporting the second gas G2. Through the second plasma, the first reformed target layer is second reformed.

At times t4 to t5, the inert gas GC continues to be provided. The inert gas GC is for exhausting by-products inside the chamber 100.

At time t5 to t6, a precursor PC is provided into the chamber 100. The second reformed target layer is reacted with the precursor PC. At times t6 to t7, the inert gas GC continues to be provided. The inert gas GC is for exhausting by-products inside the chamber 100. The reacted target layer (i.e., Al(hfac)$_3$) is in the form of a gas, and is exhausted to the outside together with the inert gas GC. Accordingly, the target layer is thermally etched.

The first cycle (cycle I) ends.

At times t7 to t8, the second cycle (cycle II) begins. Substantially the same steps as in the first cycle (cycle I) are repeated.

In summary, according to the substrate processing method according to some embodiments of the present invention, the target layer (Al$_2$O$_3$) may be atomic layer etched without using a fluorine-based source. That is, the target layer is atomic layer etched by pre-processing the target layer using a chlorine source and an oxygen source, and performing thermal etching by supplying a precursor. Since the fluorine-based source is not used, denaturation and corrosion of parts in the chamber 100 do not occur.

Figure 4:
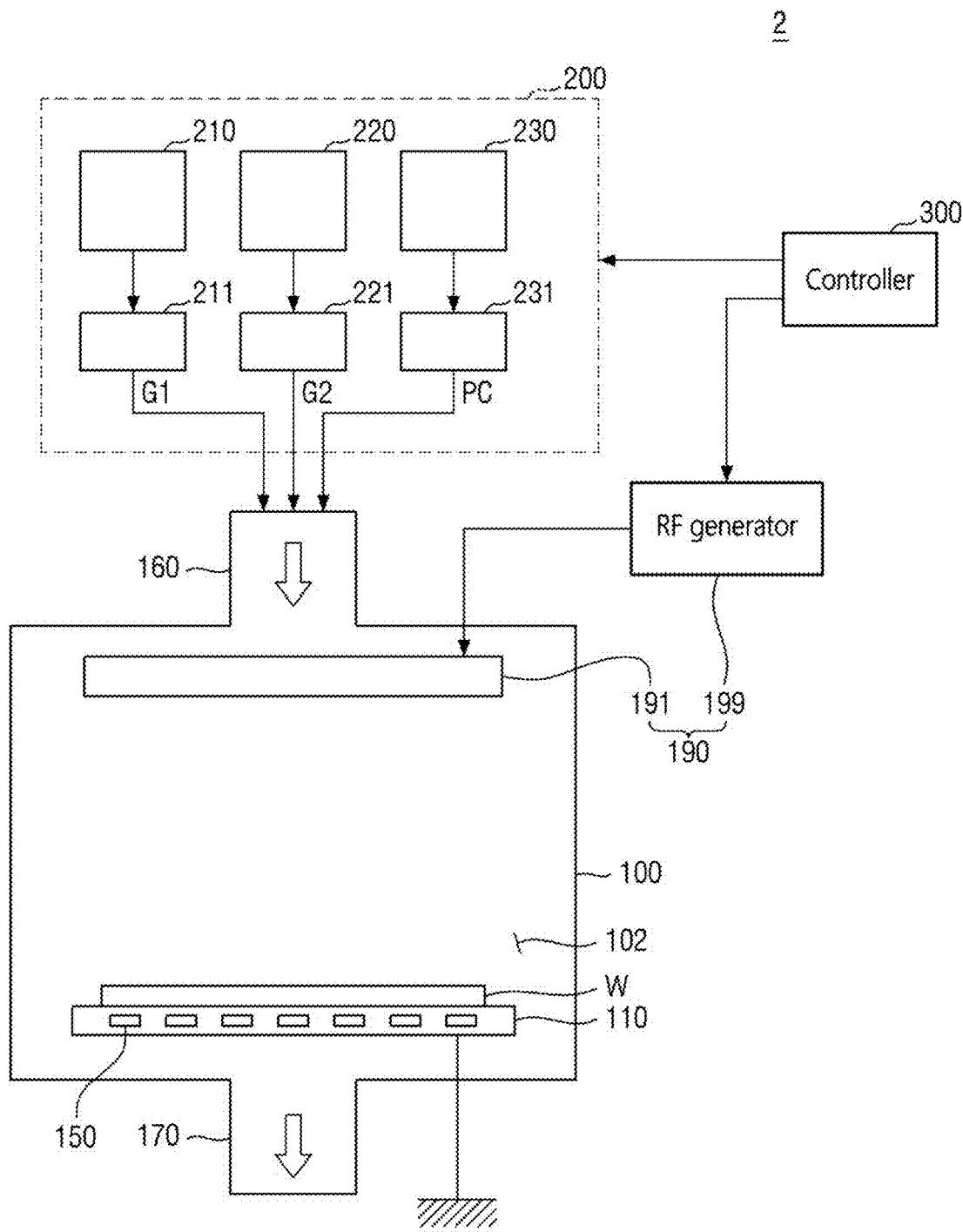
FIG. 4 is a view for describing a substrate processing apparatus according to another embodiment of the present invention.
Figure 5:
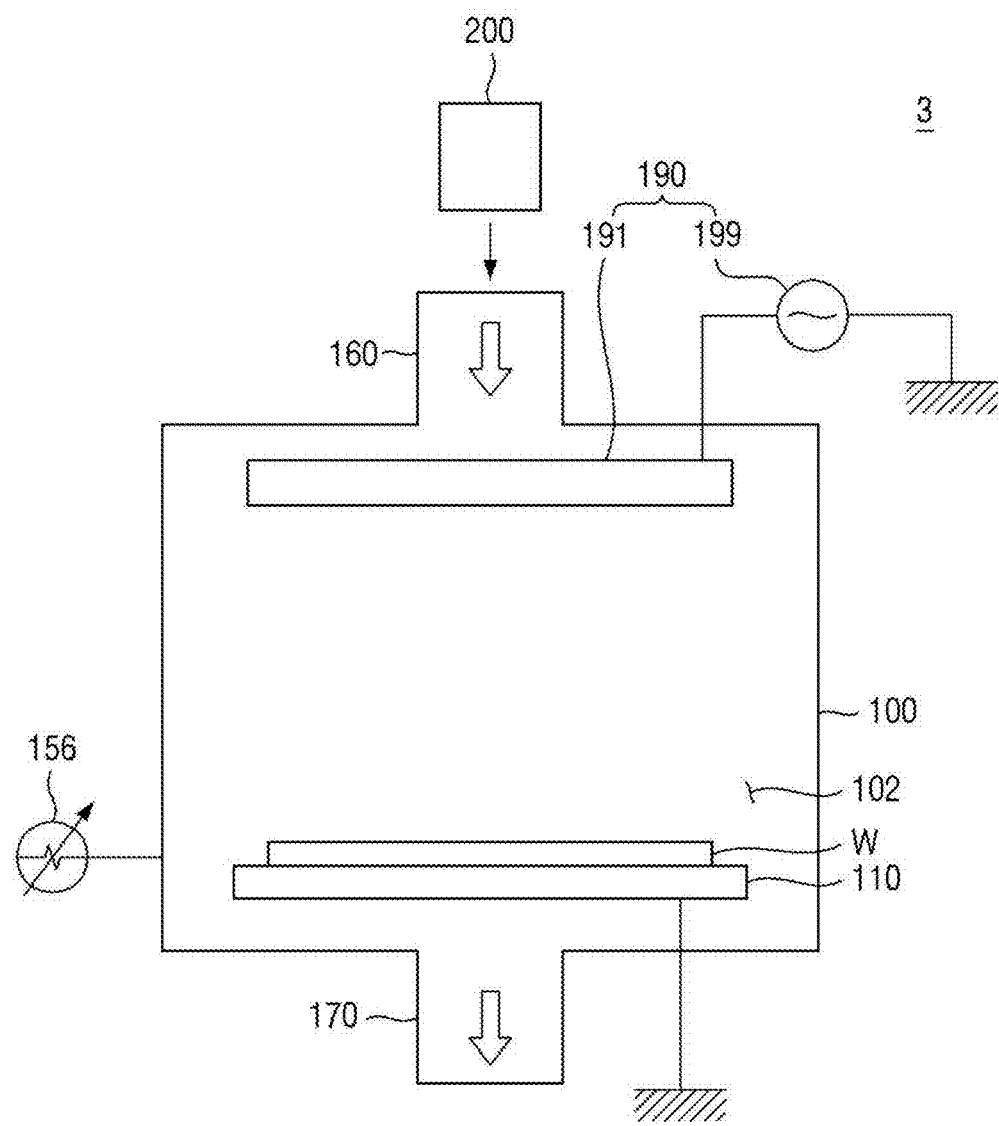
FIG. 5 is a view for describing a substrate processing apparatus according to another embodiment of the present invention.

FIG. 4 is a view for describing a substrate processing apparatus according to another embodiment of the present invention. FIG. 5 is a view for describing a substrate processing apparatus according to another embodiment of the present invention. For convenience of description, the points different from those described with reference to FIGS. 1 to 3 will be mainly described.

Referring first to FIG. 4, in the substrate processing apparatus 2 according to another embodiment of the present invention, an inlet 160 for supplying process gases to the upper surface of the chamber 100 is installed. In the substrate support 110, a heater is installed as a heat source 155.

Referring to FIG. 5, in the substrate processing apparatus 3 according to another embodiment of the present invention, an inlet 160, through which process gases are supplied, is installed on the upper surface of the chamber 100. A heat source 156 is installed on the side surface of the chamber 100. A heater may not be installed in the substrate support 110. The heat source 156 may use a flash lamp, an IR lamp, an RTP, a laser, a heater, or the like.

By using the heat source 156 using a flash lamp or the like, the temperature of the substrate W may be controlled differently for each step of the first plasma processing (S12), the second plasma processing (S14), and the thermal etching (t-ALE) (S20). For example, in the first plasma processing (S12) and the second plasma processing (S14), the temperature of the substrate W may be maintained at the same temperature, and in the thermal etching (S20), the temperature of the substrate W may be increased.

In particular, the first plasma processing (S12), the second plasma processing (S14), and the thermal etching (t-ALE) (S20) may be performed in a dual process chamber (see 100 of FIGS. 1, 4 and 5) capable of simultaneously performing plasma processing and heat processing.

Figure 6:
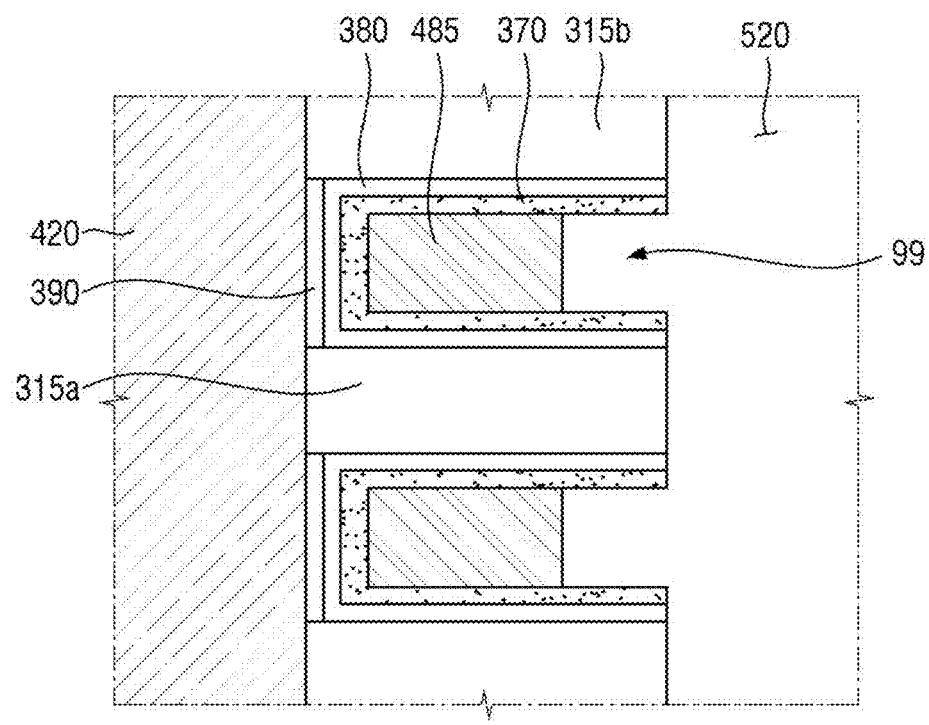
FIGS. 6 and 7 are diagrams for describing an example, to which a substrate processing method according to some embodiments of the present invention is applied.
Figure 7:
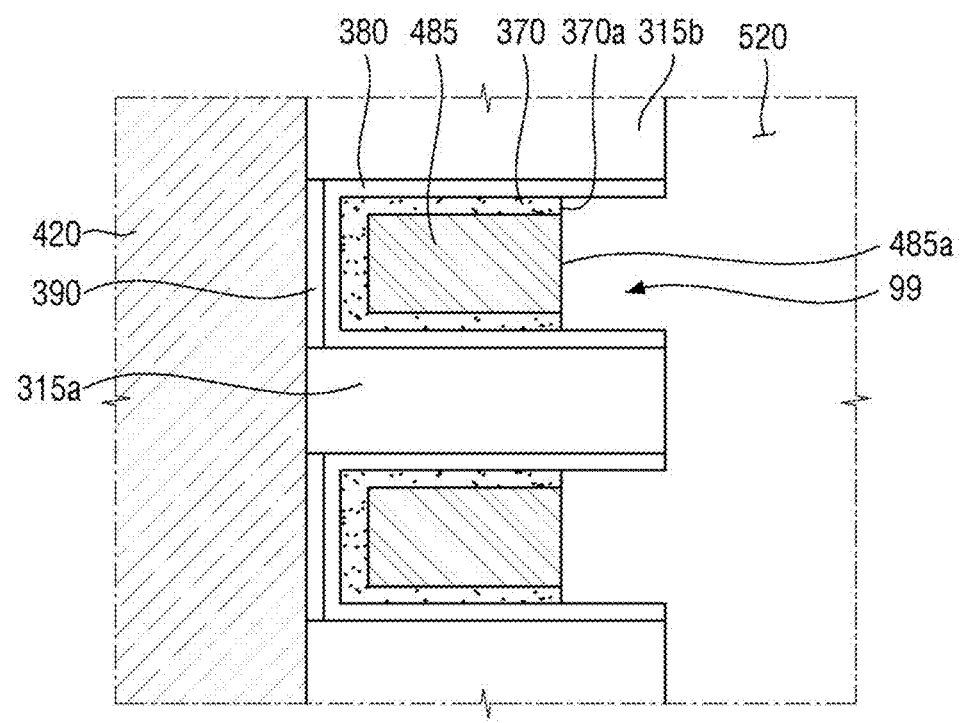

FIGS. 6 and 7 are diagrams for describing an example, to which a substrate processing method according to some embodiments of the present invention is applied. In FIGS. 6 and 7, a case, in which the substrate processing method according to some embodiments of the present invention is applied to manufacturing a vertical memory device (e.g., a three-dimensional NAND flash device), is exemplified. That is, it may be used to remove a portion of the blocking film 370 of the vertical memory device.

Referring to FIG. 6, a substrate W, on which a semiconductor device (i.e., a vertical memory device) is formed, is introduced into a chamber (see 100 of FIG. 1).

Specifically, the vertical memory device includes a plurality of interlayer insulating films 315a and 315b stacked in one direction (i.e., vertical direction). A semiconductor pattern 420 penetrating through the plurality of interlayer insulating films 315a and 315b is included. The semiconductor pattern 420 may include single crystal silicon doped with or undoped with impurities. The semiconductor pattern 420 includes a channel region.

A cell formation space 99 is located between adjacent interlayer insulating films (i.e., the first interlayer insulating film 315a and the second interlayer insulating film 315b).

A tunneling film 390 is formed in the semiconductor pattern 420 exposed by the cell formation space 99. The tunneling film 390 may include, for example, an oxide such as silicon oxide.

The charge trap film 380 may be conformally formed along the upper surface of the first interlayer insulating film 315a, the lower surface of the second interlayer insulating film 315b, and the tunneling film 390 (i.e., the sidewall of the semiconductor pattern 420). The charge trap film 380 may include, for example, a nitride such as silicon nitride.

The blocking film 370 is conformally formed along the charge trap film 380. That is, the blocking film 370 includes the charge trap film 380 on the first interlayer insulating film 315a, the charge trap film 380 in contact with the tunneling film 390, and the charge trap film 380 under the second interlayer insulating film 315b. The blocking film 370 may include a metal oxide (e.g., aluminum oxide (Al$_2$O$_3$)).

The conductive film 485 is formed to be in contact with the blocking film 370. The conductive film 485 does not completely fill the cell formation space 99 but only partially fills it. Accordingly, a portion of the blocking film 370 is exposed by the conductive film 485.

In particular, through holes 520 penetrating through the plurality of interlayer insulating films 315a and 315b are formed. The through hole 520 may be, for example, a hole for forming a common source line (CSL). The through hole 520 and the cell formation space 99 not filled by the conductive film 485 are connected to each other.

Referring to FIG. 7, the blocking film 370 exposed by the conductive film 485 is removed by performing atomic layer etching.

Specifically, the substrate W is pre-processed. That is, a first plasma is formed in the chamber 100 using a first gas G1 containing chlorine, and a second plasma is formed in the chamber using a second gas G2 containing oxygen.

Next, a precursor PC is provided into the chamber 100 to react the blocking film 370 exposed by the conductive film 485 with the precursor PC, thereby etching the blocking film 370 in units of atoms.

Next, the blocking film 370 exposed by the conductive film 485 is removed by repeating the above-described forming first plasma, forming second plasma, and providing the precursor PC. As a result, as shown in FIG. 7, one surface 485a of the conductive film 485 and one surface 370a of the blocking film 370 may be aligned with each other. One surface 485a of the conductive film 485 and one surface 370a of the blocking film 370 are exposed to the cell formation space 99.

Figure 8:
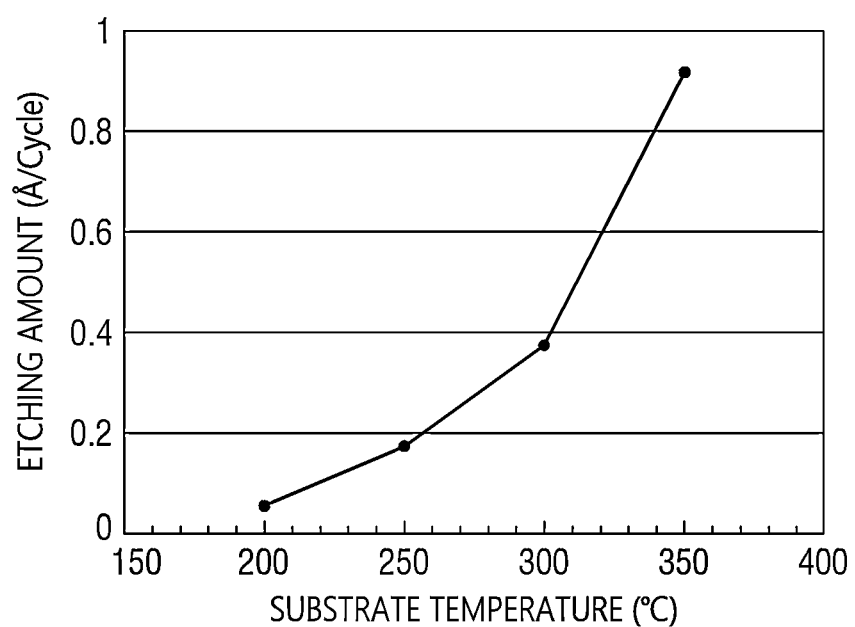
FIG. 8 is a view for describing an experimental result using a substrate processing method according to some embodiments of the present invention.

Hereinafter, with reference to FIG. 8 and Table 1, experimental results using the substrate processing method according to some embodiments of the present invention will be described. FIG. 8 is a view for describing an experimental result using a substrate processing method according to some embodiments of the present invention.

Referring to Table 1 first, the target layer includes aluminum oxide ($Al_2O_3$).

While performing the first plasma processing (S12 in FIG. 2), the second plasma processing (S14 in FIG. 2), and thermal etching (S20 in FIG. 2), the substrate temperature is maintained at 200° C.

In relation to the first plasma processing (S12 in FIG. 2), the first gas ($Cl_2$) is supplied at 30 sccm and the inert gas (Ar) is supplied at 500 sccm into the chamber (corresponding to t1 to t2 in FIG. 3). The first plasma is generated using the first gas ($Cl_2$). Then, the inert gas (Ar) is supplied into the chamber at 2000 sccm (corresponding to t2 to t3 in FIG. 3) to exhaust the by-products inside the chamber.

With respect to the second plasma processing (S14 in FIG. 2), the second gas (O2) is supplied at 30 sccm and the inert gas (Ar) is supplied at 500 sccm into the chamber (corresponding to t3 to t4 in FIG. 3). The second plasma is generated using the second gas (O2). Then, the inert gas (Ar) is supplied into the chamber at 2000 sccm (corresponding to t4 to t5 in FIG. 3) to exhaust the by-products inside the chamber.

With respect to the thermal etching (S20 in FIG. 2), 25 sccm is supplied into the chamber by combining the precursor (Hfac) and the inert gas (Ar) (corresponding to t5 to t6 in FIG. 3). Then, the inert gas (Ar) is supplied into the chamber at 2000 sccm (corresponding to t6 to t7 in FIG. 3) to exhaust the by-products inside the chamber.

The above-described first plasma processing (S12), second plasma processing (S14), and thermal etching (S20) are performed while the substrate temperature is changed to 250° C., 300° C., and 350° C. The above-described experimental conditions are summarized in [Table 1].

TABLE 1

| | First plasma processing | | Second plasma processing | | Thermal etching (t-ALE) | |
|---|---|---|---|---|---|---|
| | | | | | Hfac and | |
| Substrate temperature | $Cl_2$/Ar (t1~t2) | Ar (t2~t3) | $O_2$/Ar (t3~t4) | Ar (t4~t5) | Ar (t5~t6) | Ar (t6~t7) |
| 200° C. | 30/500 | 2000 | 30/500 | 2000 | 25 | 2000 |
| 250° C. | | | | | | |
| 300° C. | | | | | | |
| 350° C. | | | | | | |

The experimental results according to the experimental conditions of [Table 1] are shown in FIG. 8.

Referring to FIG. 8, the x-axis represents the substrate temperature (unit: ° C.), and the y-axis represents the amount of etching (unit: A/cycle).

When the substrate temperature is 200° C., the etching amount per a cycle (EPC) is 0.06 Å. When the substrate temperature is 250° C., the etching amount per a cycle is 0.18 Å. When the substrate temperature is 300° C., the etching amount per a cycle is 0.38 Å. When the substrate temperature is 350° C., the etching amount per a cycle is 0.92 Å. As the substrate temperature increases, the etching amount per a cycle increases, and as the substrate temperature decreases, the etching amount per a cycle decreases.

Although embodiments of the present invention have been described with reference to the above and the accompanying drawings, those skilled in the art, to which the present invention pertains, can understand that the present invention may be practiced in other specific forms without changing its technical spirit or essential features. Therefore, it should be understood that the embodiments described above are illustrative in all respects and not limiting.

What is claimed is:

1. A method for processing a substrate comprising:
providing a substrate including a target layer in a chamber,
forming a first plasma in the chamber by using a first gas containing chlorine to first reform the target layer, wherein the substrate is controlled to a first temperature while forming the first plasma,
forming a second plasma in the chamber by using a second gas containing oxygen to second reform the first reformed target layer, wherein the substrate is controlled to a second temperature while forming the second plasma,
providing a precursor into the chamber to react the second reformed target layer with the precursor, wherein the substrate is controlled to a third temperature while providing the precursor and
removing at least a portion of the target layer by repeating forming the first plasma, forming the second plasma, and providing the precursor,
wherein the first temperature at the forming of the first plasma and the second temperature at the forming the second plasma are the same as each other, and
wherein the third temperature at the providing of the precursor is higher than the first temperature at the forming of the first plasma and the second temperature at the forming the second plasma.

2. The method of claim 1, wherein the third temperature is 50° C. or more and 400° C. or less.

3. The method of claim 1, wherein the precursor comprises a diketone series gas.

4. The method of claim 3, wherein the precursor is at least one selected from a group comprising Hfac (Hexafluoroacetylacetone), Acac (Acetylacetone) and Dmac (Dimethylacetamide).

5. The method of claim 1, wherein the first gas is at least one selected from a group comprising $Cl_2$, HCl, $SiCl_4$, $CCl_4$ and $BCl_3$.

6. The method of claim 1, wherein the second gas is at least one selected from a group comprising $O_2$, $H_2O$, $N_2O$, and $O_3$.

7. The method of claim 1, wherein forming the first plasma, forming the second plasma, and providing the precursor are performed in a dual process chamber capable of simultaneously performing plasma processing and heat processing.

8. A method for processing a substrate comprising:
introducing a substrate having a semiconductor device formed thereon into a chamber, wherein the semiconductor device includes a first interlayer insulating film, a second interlayer insulating film formed on the first interlayer insulating film, a semiconductor pattern penetrating the first interlayer insulating film and the second interlayer insulating film, a charge trap film conformally formed along an upper surface of the first interlayer insulating film, a lower surface of the second interlayer insulating film, and a sidewall of the semiconductor pattern, a blocking film conformally formed along the charge trap film, and a conductive film formed to be in contact with the blocking film, wherein a portion of the blocking film is exposed from the conductive film, forming a first plasma in the chamber by using a first gas containing chlorine, wherein the substrate is controlled to a first temperature while forming the first plasma, forming a second plasma in the chamber by using a second gas containing oxygen, wherein the substrate is controlled to a second temperature while forming the second plasma, providing a precursor into the chamber to react the precursor with the portion of the blocking film exposed from the conductive film, wherein the substrate is controlled to a third temperature while providing the precursor, and removing at least the portion of the blocking film exposed from the conductive film by repeating forming the first plasma, forming the second plasma, and providing the precursor, wherein the first temperature at the forming of the first plasma and the second temperature at the forming the second plasma are the same as each other, and wherein the third temperature at the providing of the precursor is higher than the first temperature at the forming of the first plasma and the second temperature at the forming the second plasma.

9. The method of claim 8, wherein the blocking film comprises a metal oxide.

10. The method of claim 8, wherein the charge trap film comprises a nitride.

11. The method of claim 8, wherein the precursor comprises a diketone series gas.

12. The method of claim 8, wherein the substrate is controlled to a first temperature while forming the first plasma, wherein the substrate is controlled to a second temperature while forming the second plasma, wherein the substrate is controlled to a third temperature while providing the precursor.

13. The method of claim 12, wherein the third temperature is 50° C. or more and 400° C. or less.

14. An apparatus for processing a substrate comprising:
a heat source installed in a chamber and for heating a substrate;
a gas supply system for supplying a first gas, a second gas and a precursor into the chamber;
an electrode system for generating plasma using the first gas or the second gas supplied into the chamber; and
a controller for controlling the heat source, the gas supply system and the electrode system to atomic layer etch a target layer of the substrate, wherein the atomic layer etching comprises, supplying a first gas containing chlorine into the chamber and forming a first plasma based on the first gas to first reform the target layer, wherein the substrate is controlled to a first temperature while forming the first plasma, supplying a second gas containing oxygen into the chamber and forming a second plasma based on the second gas to second reform the first reformed target layer, wherein the substrate is controlled to a second temperature while forming the second plasma, providing a precursor into the chamber to react the second reformed target layer with the precursor, wherein the substrate is controlled to a third temperature while providing the precursor, and removing at least a portion of the target layer by repeating forming the first plasma, forming the second plasma, and providing the precursor, wherein the first temperature at the forming of the first plasma and the second temperature at the forming the second plasma are the same as each other, and wherein the third temperature at the providing of the precursor is higher than the first temperature at the forming of the first plasma and the second temperature at the forming the second plasma.

15. The apparatus of claim 14, wherein the precursor is supplied from a sidewall of the chamber, and the heat source is installed on an upper surface of the chamber.

16. The apparatus of claim 14, wherein the precursor is supplied from an upper surface of the chamber, and the heat source is installed on a sidewall of the chamber.

17. The apparatus of claim 14, wherein the precursor comprises a diketone series gas.

* * * * *